United States Patent
Zhang et al.

(10) Patent No.: US 10,475,612 B2
(45) Date of Patent: Nov. 12, 2019

(54) ELECTRICAL RELAY SYSTEM WITH FAILURE DETECTION

(71) Applicant: Rockwell Automation Asia Pacific Business Center, Pte. Ltd., Singapore (SG)

(72) Inventors: Rain Jilin Zhang, Singapore (SG); Edward C. Hopsecger, Mentor, OH (US); Joseph G. Vazach, Mentor, OH (US)

(73) Assignee: Rockwell Automation Asia Pacific Business Center, Pte. Ltd., Singapore (SG)

( * ) Notice: Subject to any disclaimer, the term of this patent is extended or adjusted under 35 U.S.C. 154(b) by 322 days.

(21) Appl. No.: 15/498,808

(22) Filed: Apr. 27, 2017

(65) Prior Publication Data

US 2018/0315565 A1 Nov. 1, 2018

(51) Int. Cl.
| | |
|---|---|
| *H01H 47/00* | (2006.01) |
| *G01R 31/327* | (2006.01) |
| *H01H 50/54* | (2006.01) |
| *H02H 1/00* | (2006.01) |
| *H01H 50/14* | (2006.01) |

(52) U.S. Cl.
CPC ....... *H01H 47/002* (2013.01); *G01R 31/3278* (2013.01); *H01H 50/14* (2013.01); *H01H 50/54* (2013.01); *H02H 1/003* (2013.01)

(58) Field of Classification Search
USPC ...................................................... 361/160
See application file for complete search history.

(56) References Cited

U.S. PATENT DOCUMENTS

| | | | |
|---|---|---|---|
| 7,208,955 B2 | 4/2007 | Zansky et al. | |
| 2006/0212745 A1* | 9/2006 | Zansky | G01R 31/3277 714/6.12 |
| 2009/0103228 A1* | 4/2009 | Elderbaum | H01H 9/167 361/187 |
| 2009/0251835 A1 | 10/2009 | Meinherz | |
| 2010/0306630 A1* | 12/2010 | Yamada | G05B 9/03 714/799 |
| 2016/0225560 A1 | 8/2016 | Fukumoto et al. | |

FOREIGN PATENT DOCUMENTS

| | | |
|---|---|---|
| DE | 10 2015 104 211 | 9/2016 |
| EP | 1 202 313 | 5/2002 |

OTHER PUBLICATIONS

Extended European Search Report dated Sep. 13, 2018; Application No. 18169384.7; 11 pages.

\* cited by examiner

*Primary Examiner* — Danny Nguyen
(74) *Attorney, Agent, or Firm* — Boyle Fredrickson, S.C.

(57) ABSTRACT

An electrical relay system is configured to allow for failure detection of a relay by injecting a signal at a common contact of the relay and looking for the signal at a normally closed contact of the relay. If the relay is commanded to be "off," or closed, and the injected signal is not detected through the normally closed contact of the relay, then the system can determine that a failure condition has occurred. In one aspect, the system can include multiple relays with the signal being injected at a common node of the relays. In another aspect, the system can include multiple controllers for controlling and/or monitoring the electrical relay system. The electrical relay system can be coupled to screw terminals for connecting to a field device as part of an industrial automation system.

19 Claims, 2 Drawing Sheets

ELECTRICAL RELAY SYSTEM WITH FAILURE DETECTION

FIELD OF THE INVENTION

The present invention relates to the field of industrial control systems, and more particularly, to an electrical relay system configured to allow for failure detection by injecting a signal at a common contact of a relay and looking for the signal at a normally closed contact of the relay.

BACKGROUND OF THE INVENTION

Industrial controllers are specialized computer systems used for the control of industrial processes or machinery, for example, in a factory environment. Generally an industrial controller executes a stored control program that reads inputs from a variety of sensors associated with the controlled process and machine and, sensing the conditions of the process or machine and based on those inputs and a stored control program, calculates a set of outputs used to control actuators controlling the process or machine.

Industrial controllers differ from conventional computers in a number of ways. Physically, they are constructed to be substantially more robust against shock and damage and to better resist external contaminants and extreme environmental conditions than conventional computers. The processors and operating systems are optimized for real-time control and are programmed with languages designed to permit rapid development of control programs tailored to a constantly varying set of machine control or process control applications.

Generally, the controllers have a highly modular architecture, for example, that allows different numbers and types of input and output modules to be used to connect the controller to the process or machinery to be controlled. This modularity is facilitated through the use of special "control networks" suitable for highly reliable and available real-time communication. Such control networks (for example, ControlNet or EtherNet/IP) differ from standard communication networks (such as Ethernet) by guaranteeing maximum communication delays by pre-scheduling the communication capacity of the network, and/or providing redundant communication capabilities for high-availability.

Industrial controllers often use electrical relays to control field devices that are part of the industrial process. Such relays typically have a common contact that can switch between a normally closed contact and a normally open contact according to energization of an electrical coil. For example, when a coil is de-energized, the relay can default to an "off" position in which the common contact connects to the normally closed contact, leaving the normally open contact disconnected. Conversely, when the coil is energized, the relay can switch to an "on" position in which the common contact connects to the normally open contact. However, such relays can sometimes fail by electrical contacts becoming welded together, which thereby prevents the relays from being able to switch between the on and off positions. For industrial automation systems which typically require greater safety and reliability than conventional systems, it is highly desirable to quickly detect such failures so that corrective action can be taken.

SUMMARY OF THE INVENTION

An electrical relay system is configured to allow for failure detection of a relay by injecting a signal at a common contact of the relay and looking for the signal at a normally closed contact of the relay. If the relay is commanded to be "off," or closed, and the injected signal is not detected through the normally closed contact of the relay, then the system can determine that a failure condition has occurred. In one aspect, the system can include multiple relays with the signal being injected at a common node of the relays. In another aspect, the system can include multiple controllers for controlling and/or monitoring the electrical relay system. The electrical relay system can be coupled to screw terminals for connecting to a field device as part of an industrial automation system.

In accordance with an aspect of the invention, a relay, such as Single Pole Double Throw ("SPDT") relay with an added detection circuit, can be used to replace a traditional force guided relay to thereby allow meeting functional safety requirements. In addition, a higher safety level for the safety relay can be achieved. Moreover, with two such relays in series, the relay system can be fault tolerant and meet safety requirements according to International Organization for Standardization ("ISO") 13849 CAT 4 and/or International Electrotechnical Commission ("IEC") 61508 Safety integrity level ("SIL") 3.

Specifically then, one aspect of the present invention can provide an electrical relay system including: a relay having a common contact configured to switch between a normally closed contact and a normally open contact according to energization of a coil; a signal generator configured to inject a signal at the common contact; and a detection circuit coupled to the normally closed contact. The detection circuit can be configured to detect the signal when the common contact is switched to the normally closed contact.

Another aspect of the present invention can provide an electrical relay system including: a first relay having a common contact configured to switch between a normally closed contact and a normally open contact according to energization of a first coil; a second relay having a common contact configured to switch between a normally closed contact and a normally open contact according to energization of a second coil, in which the common contact of the first relay is coupled to the common contact of the second relay at a common node; a signal generator configured to inject a signal at the common node; a first detection circuit coupled to the normally closed contact of the first relay, in which the first detection circuit is configured to detect the signal when the common contact of the first relay is switched to the normally closed contact of the first relay; and a second detection circuit coupled to the normally closed contact of the second relay, in which the second detection circuit is configured to detect the signal when the common contact of the second relay is switched to the normally closed contact of the second relay.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE OF THE INVENTION

Figure 1:
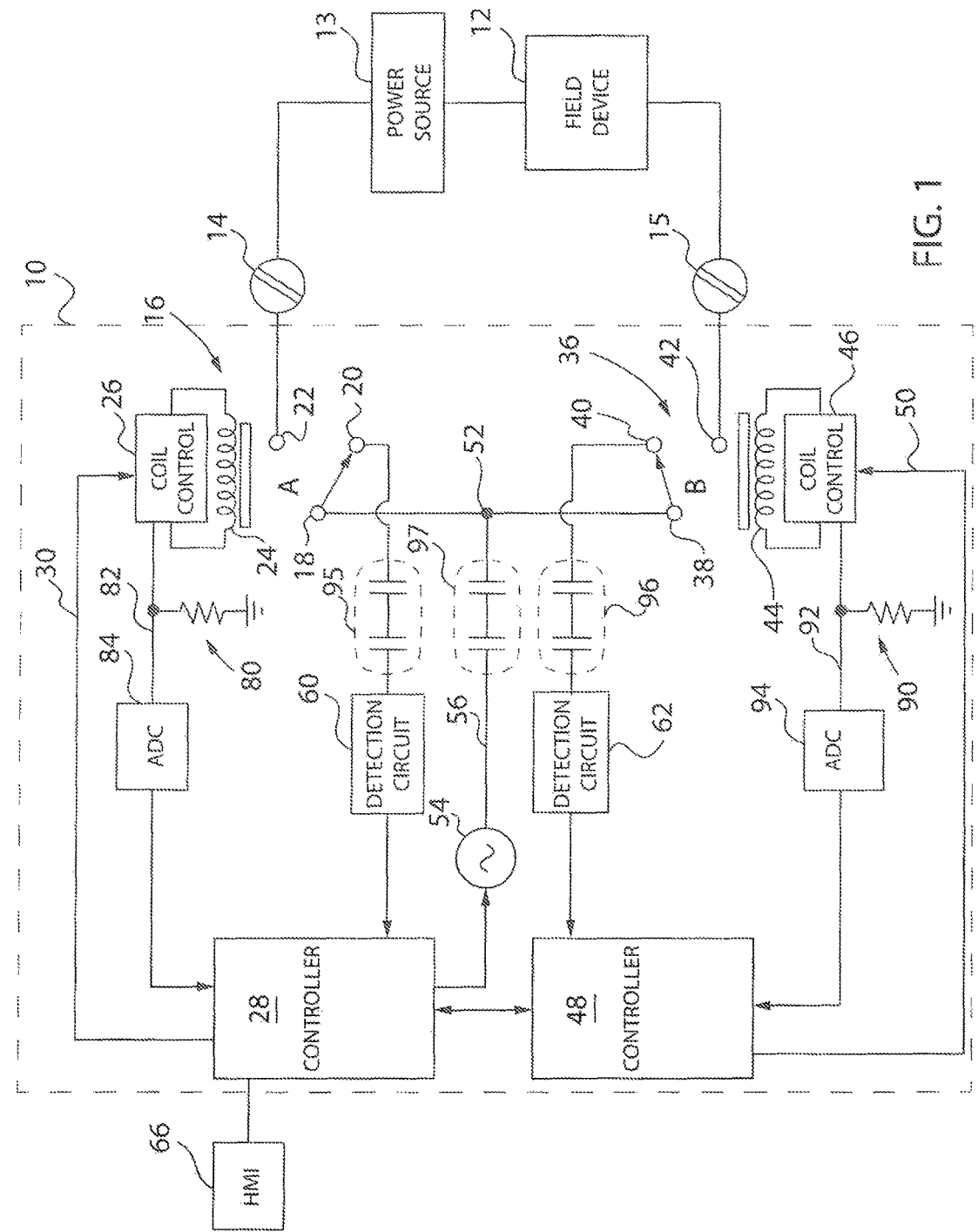
FIG. 1 is an electrical relay system having a signal generator configured to inject a signal and detection circuit configured to detect the signal in accordance with an aspect of the invention.

Referring now to FIG. 1, in accordance with an aspect of the invention, an electrical relay system 10 can be configured to provide switching control with respect to an industrial automation system, such as a field device 12 and/or power source 13. For example, the electrical relay system 10 could be used to switch the power source 13 "on," to thereby connect power to, or switch the power source 13 "off," to thereby disconnect power from, the field device 12, via first and second screw terminals 14 and 15, respectively. The power source 13 could be, for example, operating at about 120 Volts Alternating Current ("AC") at 60 Hertz.

In the electrical relay system 10, a first relay 16 (identified as "A") can have a common contact 18 configured to switch between a normally closed contact 20 and a normally open contact 22 according to energization of a first coil 24 and a core. Accordingly, in one aspect, the first relay 16 can be a Single Pole Double Throw ("SPDT") relay, though other relay configurations could be used. By way of example, when the first coil 24 is de-energized, the first relay 16 can default to an "off" position, as shown, in which the common contact 18 connects to the normally closed contact 20, leaving the normally open contact 22 disconnected. Conversely, when the first coil 24 is energized, the first relay 16 can switch to an "on" position in which the common contact 18 connects to the normally open contact 22, leaving the normally closed contact 20 disconnected. The first coil 24 can be energized or de-energized by a first coil control circuit 26 which, in turn, can be commanded (for switching the first relay 16 between the on and off positions) by a first controller 28, which could comprise an industrial controller, a microcontroller, a Programmable Logic Device ("PLD") and/or other programmable logic. In one aspect, the first controller 28 can control the first coil 24 via a first Pulse Width Modulation ("PWM") signal 30. Using a PWM signal to control the first coil control circuit 26 can allow the electrical relay system 10 to minimize power and heat dissipation to prolong the life of the first relay 16. The normally open contact 22 can be connected to the first screw terminal 14 for controlling such switching to the field device 12.

Similarly, a second relay 36 (identified as "B") can have a common contact 38 configured to switch between a normally closed contact 40 and a normally open contact 42 according to energization of a second coil 44 and a core. Accordingly, in one aspect, the second relay 36 can be an SPDT relay, though other relay configurations could be used. By way of example, when the second coil 44 is de-energized, the second relay 36 can default to an "off" position, as shown, in which the common contact 38 connects to the normally closed contact 40, leaving the normally open contact 42 disconnected. Conversely, when the second coil 44 is energized, the second relay 36 can switch to an "on" position in which the common contact 38 connects to the normally open contact 42, leaving the normally closed contact 40 disconnected. The second coil 44 can be energized or de-energized by a second coil control circuit 46 which, in turn, can be commanded (for switching the second relay 36 between the on and off positions) by a second controller 48, which could comprise an industrial controller, a microcontroller, a PLD and/or other programmable logic. In one aspect, the second controller 48 can control the second coil 44 via a second PWM signal 50. Using a PWM signal to control the second coil control circuit 46 can allow the electrical relay system 10 to minimize power and heat dissipation to prolong the life of the second relay 36. The first and second controllers 28 and 48, respectively, can be in communication with one another. The normally open contact 42 can be connected to the second screw terminal 15 for controlling such switching to the field device 12.

The common contact 18 of the first relay 16 can be coupled to the common contact 38 of the second relay 36 at a common node 52. A signal generator 54 can be configured to inject a signal 56 at the common node 52. The signal 56 can be any signal which may be recognizable by a detection circuit, such as an Alternating Current ("AC") signal having a particular frequency, amplitude and/or phase, or more preferably, a Direct Current ("DC") signal having an adjustable amplitude and/or polarity to produce a pulse. The first controller 28 can control the signal generator 54 to provide the signal 56 to the common node 52

A first detection circuit 60 can be coupled to the normally closed contact 20 of the first relay 16. The first detection circuit 60 can be configured to detect the signal 56, such as by comparing the signal 56 to a predetermined reference using a comparator. The first detection circuit 60, in turn, can communicate with the first controller 28 to indicate a presence or absence of the signal 56. Accordingly, in normal operation, when the common contact 18 of the first relay 16 is switched to the normally closed contact 20, the first detection circuit 60 can detect the signal 56 and, in turn, indicate presence of the signal 56 to the first controller 28. However, in normal operation, when the common contact 18 of the first relay 16 is switched to the normally open contact 22, the first detection circuit 60 would not detect the signal 56 and, in turn, would indicate absence of the signal 56 to the first controller 28.

Similarly, a second detection circuit 62 can be coupled to the normally closed contact 40 of the second relay 36. The second detection circuit 62 can also be configured to detect the signal 56, such as by comparing the signal 56 to a predetermined reference using a comparator. The second detection circuit 62, in turn, can communicate with the second controller 48 to indicate a presence or absence of the signal 56. The second controller 48, in turn, can communicate such results to the first controller 28. Accordingly, in normal operation, when the common contact 38 of the second relay 36 is switched to the normally closed contact 40, the second detection circuit 62 can detect the signal 56 and, in turn, indicate presence of the signal 56 to the second controller 48. However, in normal operation, when the common contact 38 of the second relay 36 is switched to the normally open contact 42, the second detection circuit 62 would not detect the signal 56 and, in turn, would indicate absence of the signal 56 to the second controller 48.

To provide failure detection, the signal generator 54 can be controlled by the first controller 28 to send the signal 56 before and/or after the electrical relay system 10 is commanded to switch the field device 12 on and/or off. Such command could come from the first controller 28 executing an industrial control program, and/or an operator, such as via a Human Machine Interface ("HMI") 66. If the signal 56 is detected by the first detection circuit 60 or the second detection circuit 62 when the electrical relay system 10 is commanded to switch the field device 12 on, the first controller 28 can determine a failure condition to be present, and can report such a failure condition, such as to the screen of the HMI 66. Similarly, if the signal 56 is failed to be detected by the first detection circuit 60 or the second detection circuit 62 when the electrical relay system 10 is commanded to switch the field device 12 off, the first controller 28 can again determine a failure condition to be present, and can report such a failure condition.

Figure 2:
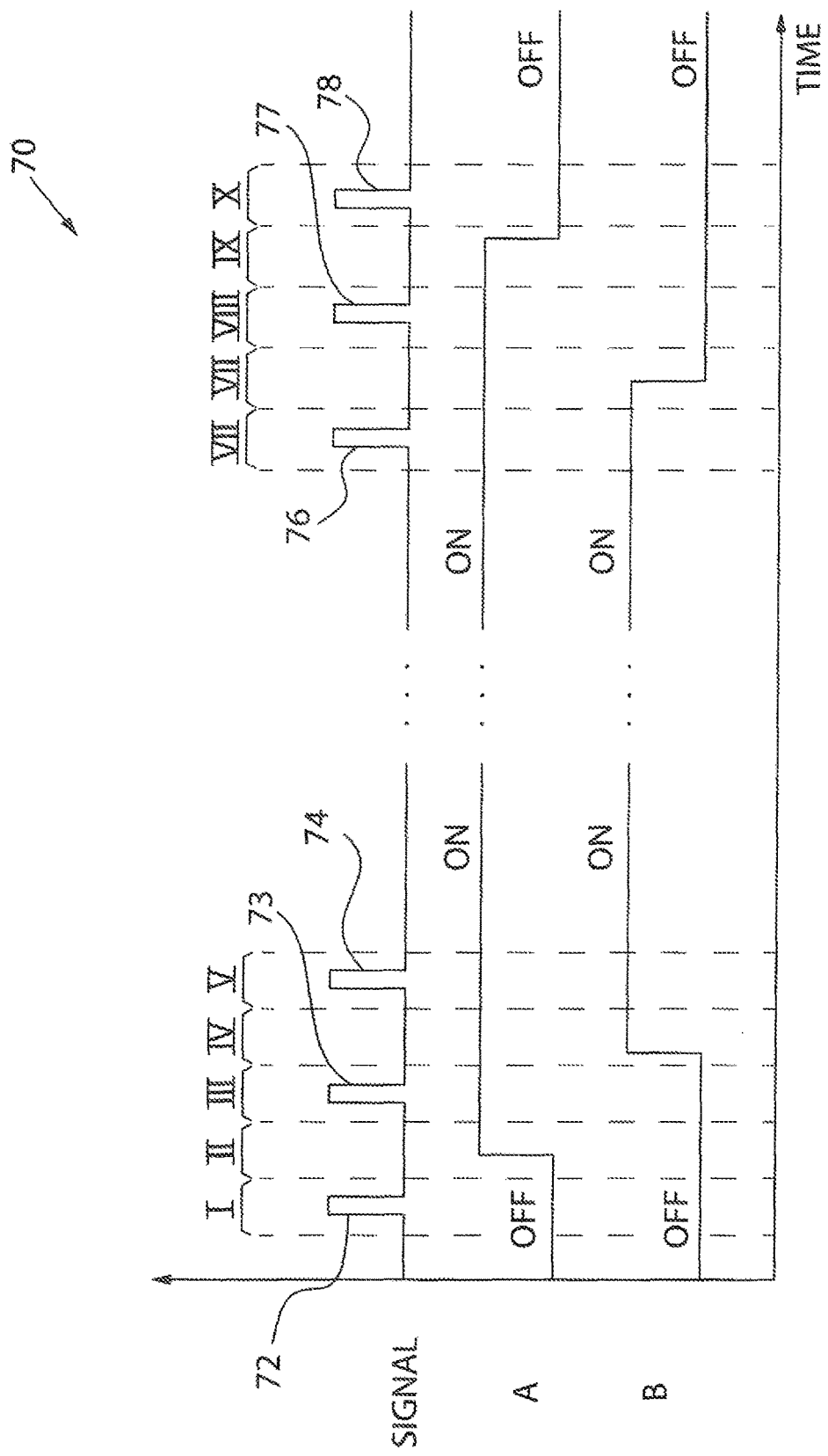
FIG. 2 is an exemplar electrical timing diagram for the electrical relay system of FIG. 1.

With additional reference to FIG. 2, an exemplar electrical timing diagram 70 for the electrical relay system 10 is provided in accordance with an aspect of the invention. For the electrical relay system 10 to switch the field device 12 to an on position, in a first time period "I," the signal generator 54 can be controlled to send the signal 56, which could be a a first pulse 72, which could be less than 10 microseconds in duration, and preferably about 3 microseconds in duration. If the electrical relay system 10 fails to detect the signal 56 (which is the first pulse 72) via the first and second detection circuits 60 and 62, respectively, the electrical relay system 10 can determine a failure condition to be present.

Next, in a second time period "II," the electrical relay system 10 can command the first relay 16 (identified as "A") only to switch to an on position, via the first coil control circuit 26 and the first controller 28, while the second relay 36 (identified as "B") remains in the off position. Accordingly, the second relay 36 is delayed. Then, in a third time period "III," the signal generator 54 can be controlled to send the signal 56 again, which could be a second pulse 73, which could be less than 10 microseconds in duration, and preferably about 3 microseconds in duration. If the electrical relay system 10 detects the signal 56 (which is now the second pulse 73) via the first detection circuit 60, or fails to detect the signal 56 via the second detection circuit 62, in the third time period, the electrical relay system 10 can determine a failure condition to be present. By delaying activation of the second relay 36 in this way, the possibility of arcing, which could result in welding of contacts thereby causing a failure, can be reduced. In addition, the first and second relays 16 and 36, respectively, can be tested independently of one another. The second relay 36 can be delayed, for example, by 5 milliseconds.

Next, in a fourth time period "IV," the electrical relay system 10 can command the second relay 36 to switch to an on position, via the second coil control circuit 46 and the second controller 48, while the second relay 36 remains in the on position. Then, in a fifth time period "V," the signal generator 54 can be controlled to send the signal 56 again, which could be a third pulse 74, which could be less than 10 microseconds in duration, and preferably about 3 microseconds in duration. If the electrical relay system 10 detects the signal 56 (which is now the third pulse 74) via the first or second detection circuits 60 or 62, respectively, in the fifth time period, the electrical relay system 10 can determine a failure condition to be present.

For the electrical relay system 10 to switch the field device 12 back to the off position, in a sixth time period "VI," the signal generator 54 can be controlled to send the signal 56, which could be a fourth pulse 76, which could be less than 10 microseconds in duration, and preferably about 3 microseconds in duration. If the electrical relay system 10 detects the signal 56 (which is the fourth pulse 76) via the first or second detection circuits 60 or 62, respectively, the electrical relay system 10 can determine a failure condition to be present.

Next, in a seventh time period "VII," the electrical relay system 10 can command the second relay 36 (identified as "B") only to switch to the off position, via the second coil control circuit 46 and the second controller 48, while the first relay 16 (identified as "A") remains in the on position. Accordingly, the first relay 16 is delayed. Then, in a eighth time period "VIII," the signal generator 54 can be controlled to send the signal 56 again, which could be a fifth pulse 77, which could be less than 10 microseconds in duration, and preferably about 3 microseconds in duration. If the electrical relay system 10 detects the signal 56 (which is now the fifth pulse 77) via the first detection circuit 60, or fails to detect the signal 56 via the second detection circuit 62, in the eighth time period, the electrical relay system 10 can determine a failure condition to be present. By delaying deactivation of the first relay 16 in this way, the possibility of arcing, which could result in welding of contacts thereby causing a failure, can be reduced. In addition, the first and second relays 16 and 36, respectively, can be tested independently of one another. The first relay 16 can be delayed, for example, by 5 milliseconds.

Next, in a ninth time period "IX," the electrical relay system 10 can command the first relay 16 to switch to the off position, via the first coil control circuit 26 and the first controller 28, while the second relay 36 remains in the off position. Then, in a tenth time period "X," the signal generator 54 can be controlled to send the signal 56 again, which could be a sixth pulse 78, which could be less than 10 microseconds in duration, and preferably about 3 microseconds in duration. If the electrical relay system 10 fails to detect the signal 56 (which is now the sixth pulse 78) via the first and second detection circuits 60 or 62, respectively, in the tenth time period, the electrical relay system 10 can determine a failure condition to be present.

Referring again to FIG. 1, in another aspect of the invention, the first and second controllers 28 and 48, respectively, can monitor the energization statuses of the first and second coils 24 and 44, respectively, to determine a failure condition. A first resistor 80 can be connected between the first coil control circuity 26 and ground to convert a first current flow through the first coil 24 to a first voltage 82. The first voltage 82 can be picked up by a first Analog to Digital Converter ("ADC") 84 which, in turn, could provide a digital representation of the energization status of the first coil 24 to the first controller 28. Accordingly, if the first controller 28 is controlling the first coil 24 to energize, such as by way of the first PWM signal 30, but the first ADC 84 is indicating the first coil 24 is de-energized due to a lack of current sensing, the electrical relay system 10 can determine a failure condition to be present. Conversely, if the first controller 28 is controlling the first coil 24 to de-energize, but the first ADC 84 is indicating the first coil 24 is energized due to a sensed current, the electrical relay system 10 can determine a failure condition to be present.

Similarly, a second resistor 90 can be connected between the second coil control circuity 46 and ground to convert a second current flow through the second coil 44 to a second voltage 92. The second voltage 92 can be picked up by a second ADC 94 which, in turn, could provide a digital representation of the energization status of the second coil 44 to the second controller 48. Accordingly, if the second controller 48 is controlling the second coil 44 to energize, such as by way of the second PWM signal 50, but the second ADC 94 is indicating that the second coil 44 is de-energized due to a lack of current sensing, the electrical relay system 10 can determine a failure condition to be present. Conversely, if the second controller 48 is controlling the second coil 44 to de-energize, but the second ADC 94 is indicating the second coil 44 is energized due to a sensed current, the electrical relay system 10 can determine a failure condition to be present.

In addition, in another aspect of the invention, a first set of series decoupling capacitors 95 can be placed between the first detection circuit 60 and the normally closed contact 20 of the first relay 16; a second set of series decoupling capacitors 96 can be placed between the second detection circuit 62 and the normally closed contact 40 of the second relay 36; and a third set of series decoupling capacitors 97 can be placed between the signal generator 54 and the common node 52. The decoupling capacitors can provide isolation between the pulse injection and detection circuitry (the signal generator 54 and the first and second detection circuits 60 and 62, respectively) and elements of the industrial automation system beyond the first and second screw terminals 14 and 15, respectively, such as the field device 12, to provide additional fault protection from the field device 12. The signal 56 can be configured to traverse the decoupling capacitors, such as by way of short pulses less than 10 microseconds in duration, and preferably about 3 microseconds in duration, so that the signal 56 can be effectively detected by the first and/or second detection circuits 60 and/or 62, respectively. In addition, by having at least two capacitors in each set of series decoupling capacitors, redundancy can be provided to minimize the impact of a single point of failure.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. An electrical relay system comprising:
a relay having a common contact configured to switch between a normally closed contact and a normally open contact according to energization of a coil;
a signal generator configured to inject a signal at the common contact; and
a detection circuit coupled to the normally closed contact, wherein the detection circuit is configured to detect the signal when the common contact is switched to the normally closed contact,
wherein the signal generator is configured to send the signal comprising a first pulse before the relay is switched and a second pulse after the relay is switched.

2. The system of claim 1, further comprising a first decoupling capacitor between the signal generator and the common contact and a second decoupling capacitor between the detection circuit and the normally closed contact.

3. The system of claim 1, wherein the signal is a pulse less than 10 microseconds in duration.

4. The system of claim 1, further comprising a screw terminal coupled to the normally open contact for connecting to a field device.

5. The system of claim 1, wherein the detection circuit comprises a comparator.

6. The system of claim 1, wherein the relay is Single Pole Double Throw ("SPDT") relay.

7. The system of claim 1, wherein the relay is a first relay configured to switch between the normally closed contact and the normally open contact according to energization of a first coil, and further comprising a second relay having a common contact configured to switch between a normally closed contact and a normally open contact according to energization of a second coil, wherein the common contact of the first relay is coupled to the common contact of the second relay at a common node.

8. The system of claim 7, wherein the detection circuit is a first detection circuit, and further comprising a second detection circuit coupled to the normally closed contact of the second relay, wherein the second detection circuit is configured to detect the signal when the common contact of the second relay is switched to the normally closed contact of the second relay.

9. An electrical relay system comprising:
a first relay having a common contact configured to switch between a normally closed contact and a normally open contact according to energization of a first coil;
a second relay having a common contact configured to switch between a normally closed contact and a normally open contact according to energization of a second coil, wherein the common contact of the first relay is coupled to the common contact of the second relay at a common node;
a signal generator configured to inject a signal at the common node;
a first detection circuit coupled to the normally closed contact of the first relay, wherein the first detection circuit is configured to detect the signal when the common contact of the first relay is switched to the normally closed contact of the first relay; and
a second detection circuit coupled to the normally closed contact of the second relay, wherein the second detection circuit is configured to detect the signal when the common contact of the second relay is switched to the normally closed contact of the second relay.

10. The system of claim 9, further comprising first and second controllers in communication with one another, wherein the first controller is in further communication with the first coil for controlling the first relay to switch and the second controller is in further communication with the second coil for controlling the second relay to switch.

11. The system of claim 10, wherein the first controller is configured to control the first relay to switch before the second controller controls the second relay to switch.

12. The system of claim 10, wherein the first and second controllers are configured to provide first and second Pulse Width Modulation ("PWM") signals for controlling the first and second coils, respectively.

13. The system of claim 10, wherein the first controller is in further communication with the first detection circuit, and the second controller is in further communication with the second detection circuit.

14. The system of claim 10, wherein the first and second controllers are in further communication with one another, and wherein the first controller is configured to report a failure condition upon at least one of:
 the first detection circuit failing to receive the signal when the common contact of the first relay is switched to the normally closed contact of the first relay; and
 the second controller reporting a failure condition.

15. The system of claim 10, wherein the first controller is in further communication with the signal generator to provide the signal.

16. The system of claim 9, further comprising first and second screw terminals for connecting to a field device, wherein the first screw terminal is coupled to the normally open contact of the first relay and the second screw terminal is coupled to the normally open contact of the second relay.

17. The system of claim 9, further comprising first Analog to Digital Converter ("ADC") coupled between the first coil and the first controller, and a second ADC coupled between the second coil and the second controller, wherein the first and second controllers are configured to monitor the first and second coils via the first and second ADC's, respectively.

18. The system of claim 9, further comprising a first decoupling capacitor between the first detection circuit and the normally closed contact of the first relay, a second decoupling capacitor between the second detection circuit and the normally closed contact of the second relay, and a third decoupling capacitor between the signal generator and the common node.

19. The system of claim 9, wherein the first and second relays are SPDT relays.

* * * * *